United States Patent
Redman-White et al.

(10) Patent No.: US 10,447,007 B2
(45) Date of Patent: Oct. 15, 2019

(54) METHOD AND SYSTEM FOR CONTROLLING LASER MODULATION

(71) Applicant: Hilight Semiconductor Limited, Hampshire (GB)

(72) Inventors: William Redman-White, Cambridge (GB); Dominique Coue, Cambridge (GB); Colin Whitfield, Cambridge (GB)

(73) Assignee: HILIGHT SEMICONDUCTOR LIMITED, Hampshire (GB)

( * ) Notice: Subject to any disclaimer, the term of this patent is extended or adjusted under 35 U.S.C. 154(b) by 0 days.

(21) Appl. No.: 15/185,422

(22) Filed: Jun. 17, 2016

(65) Prior Publication Data
US 2016/0372887 A1     Dec. 22, 2016

(30) Foreign Application Priority Data
Jun. 19, 2015 (GB) .................. 1510830.1

(51) Int. Cl.
| | |
|---|---|
| *H01S 5/042* | (2006.01) |
| *H01S 5/0683* | (2006.01) |
| *H01S 5/068* | (2006.01) |
| *H04B 10/25* | (2013.01) |
| *H04B 10/50* | (2013.01) |

(52) U.S. Cl.
CPC ............ *H01S 5/042* (2013.01); *H01S 5/0427* (2013.01); *H01S 5/06808* (2013.01); *H01S 5/06832* (2013.01); *H01S 5/06835* (2013.01); *H04B 10/25* (2013.01); *H04B 10/503* (2013.01); *H01S 5/06812* (2013.01)

(58) Field of Classification Search
CPC ............... H01S 5/0427; H01S 5/06808; H01S 5/06812; H01S 5/06835; H01S 5/06832
See application file for complete search history.

(56) References Cited

U.S. PATENT DOCUMENTS

| | | | | |
|---|---|---|---|---|
| 6,654,565 B2 * | 11/2003 | Kenny | ................. | H04J 14/028 348/E7.07 |
| 2005/0105569 A1 | 5/2005 | Senga et al. | | |
| 2012/0263202 A1* | 10/2012 | Steinle | ............... | H05B 33/0851 372/38.02 |

(Continued)

*Primary Examiner* — Tod T Van Roy
(74) *Attorney, Agent, or Firm* — Squire Patton Boggs (US) LLP

(57) ABSTRACT

A system comprising drive circuitry configured to apply in a start-up phase a first drive current and then a second different drive current to a laser diode, the first drive current and second drive current being such that the laser diode is configured to provide a first optical output and a second optical output respectively. The system further comprising an optical sensor configured to provide a first sensor output corresponding to the first optical output of the laser diode and a second sensor output corresponding to the second optical output. The system further comprises a controller configured to use a value of the first drive current, a value of the second drive current, the first sensor output, the second sensor output and at least one supplied input value to provide control values for the drive circuitry to control an operating current of the laser diode, wherein the system is arranged to be used in a communication system wherein information is transmitted in at least one burst.

19 Claims, 7 Drawing Sheets

(56) References Cited

U.S. PATENT DOCUMENTS

2014/0029635 A1    1/2014  Biegert et al.
2015/0188627 A1*   7/2015  Yuda .................... H04B 10/502
                                                                398/30

* cited by examiner

METHOD AND SYSTEM FOR CONTROLLING LASER MODULATION

FIELD OF THE INVENTION

Some embodiments relate to a system and method for controlling laser modulation.

BACKGROUND

In a fibre optical communications system it is desirable to be able to control the modulation depth of the light generated by the transmitting laser device. In order to maintain fast switching between states and reduce noise, the transmitting laser is not switched between some defined powers and then switched off, but its output is reduced to a low level. This modulation depth is also described as an extinction ratio (ER), the latter being the ratio of the optical intensity when there is a data '1' and the intensity when there is a data '0'.

The current required by the laser to deliver these relatively high and relatively low optical outputs may not however be constant and may be affected by the tolerances between individual laser devices, and over time due to the variation of a single device's characteristics due to heating and/or ageing. Such variations can occur in normal operation as a device heats up in use. There are existing methods for controlling the modulation, but these are generally intended for systems that run continuously, and thus in their operation should allow for the settling time of a feedback loop.

However, in some communication systems, for example in passive optical network (PON) applications, it is common for a transmitter to operate in a burst mode, wherein the laser modulation levels should be under control after a very few pulses of a run-in sequence. In such cases there may be little time available for a control loop to settle.

Hence it is sometimes desired not only to be able to compensate automatically for manufacturing tolerances and parameter drift of the laser itself, but also to be able to reach a defined target modulation level within a very short time period, and with only a very small number of pulses being passed through the system.

Techniques for controlling the modulation (or ER) in a relatively steady state are known. Some are related to a technique presented by Smith (Electronics Letters, October 1978 pp 775-776), wherein a low amplitude low frequency (LF) modulation is added to the normal laser current. The fluctuations in the optical output from the laser at the known LF modulation frequency permits the estimation of the slope of the laser current/optical output characteristic, and hence the drive currents required for the desired average and modulated optical levels can be calculated provided that the laser characteristic does not have excessive non-linearity. It is thus possible to construct a feedback loop to maintain reasonable control over the modulation depth (or ER) provided that the feedback loop implied in this has time to settle.

SUMMARY

According to an aspect, there is provided a system comprising: drive circuitry configured to apply in a start-up phase a first drive current and then a second different drive current to a laser diode, said first drive current and second drive current being such that said laser diode is configured to provide a first optical output and a second optical output respectively; an optical sensor configured to provide a first sensor output corresponding to the first optical output of said laser diode and a second sensor output corresponding to said second optical output; and a controller configured to use said first drive current, said second drive current, said first sensor output and said second sensor output to provide control values for said drive circuitry to control a modulation depth of said laser diode.

The drive circuitry may be configured to control a bias current applied to said laser diode and a modulation current applied to said laser diode.

The control values may be configured to control the bias current and modulation current applied by said drive circuitry to said laser diode.

The controller may be configured to use said first drive current, said second drive current, said first sensor output and said second sensor output to determine an average current value and a modulation current value and provide control values in dependence on said average current and modulation current values.

The controller may be configured to use said first drive current, said second drive current, said first sensor output and said second sensor output to determine a third current to be applied by the drive circuitry to said laser diode, providing a minimum operational current value, and a fourth current to be applied to said laser diode to provide a maximum operational current value and provide control values in dependence on said third and fourth current values.

The minimum operational current value is used for data '0' and said maximum operational current is used for data '1'

The system may be arranged to be used in a burst communication system and said first and second drive currents are applied within the timing of a single burst.

The system may be arranged to be used in a burst communication system and said first and second drive currents are applied within the timing of respective bursts.

The optical sensor may comprise a photodiode.

The optical sensor may comprise an analogue to digital convertor configured to convert the output of the photodiode to a digital value to provide said first and second sensor outputs.

The system may comprise a feedback loop configured to use outputs from the optical sensor and one or more stored reference values to compensate for changes in behaviour of said laser diode after said start-up phase.

The drive circuitry may be configured to such that no current is applied to said laser diode and a respective output of said optical sensor is used to correct said first and second sensor output values.

The first and second drive current values may be configured to cause the laser diode to be operated within a substantially linear region of operation.

According to another aspect, there is a system as discussed previously in combination with said laser diode.

According to another aspect, there is provided a method comprising: applying to a laser diode in a start-up phase a first drive current and then a second different drive current to a laser diode, said first drive current and second drive current being such that said laser diode is configured to provide a first optical output and a second optical output respectively; providing a first sensor output corresponding to the first optical output of said laser diode and a second sensor output corresponding to said second optical output; and using said first drive current, said second drive current, said first sensor output and said second sensor output to provide control values to control a modulation depth of said laser diode.

The method may comprise controlling a bias current applied to said laser diode and a modulation current applied to said laser diode.

The control values may be configured to control the bias current and modulation current applied to said laser diode.

The method may comprise using said first drive current, said second drive current, said first sensor output and said second sensor output to determine an average current value and a modulation current value and provide control values in dependence on said average current and modulation current values.

The method may comprise using said first drive current, said second drive current, said first sensor output and said second sensor output to determine a third current to be applied to said laser diode, providing a minimum operational current value, and a fourth current to be applied to said laser diode to provide a maximum operational current value and provide control values in dependence on said third and fourth current values.

The minimum operational current value may be used for data '0' and said maximum operational current may be used for data '1'.

The method may comprise, for burst communications, applying said first and second drive currents within the timing of a single burst.

The method may comprise, for burst communications, applying said first and second drive currents within the timing of respective bursts.

The method may comprise using optical outputs dependent on optical outputs of the laser diode and one or more stored reference values to compensate for changes in behaviour of said laser diode after said start-up phase.

The method may comprise determining an optical output when no current is applied to said laser diode and using information dependent on said determined optical output to correct said first and second sensor output values.

The first and second drive current values may cause the laser diode to be operated within a substantially linear region of operation.

According to another aspect, there is provided a method of determining control values for determining a modulation depth of a laser diode used in a burst communication mode, said method comprising: using a first drive current value, a second drive current value, a first sensor output and a second sensor output to provide control values for controlling said modulation depth of said laser diode, wherein said first drive current value is applied to said laser diode in a start-up phase to cause said laser diode to provide a first optical output, said first sensor output being dependent on said first optical output and said second drive current is subsequently applied in said start-up phase to cause said laser diode to provide a second optical output, said second sensor output being dependent on said second optical output.

A computer program comprising program code means adapted to perform at least part of the method(s) may also be provided. The computer program may be stored and/or otherwise embodied by means of a carrier medium.

In the above, many different embodiments have been described. It should be appreciated that further embodiments may be provided by the combination of any two or more of the embodiments described above.

BRIEF DESCRIPTION OF FIGURES

Some embodiments will now be described by way of example only and with reference to the accompanying drawings in which.

DETAILED DESCRIPTION OF EMBODIMENTS

Some embodiments will now be described by way of example only.

Figure 1A:
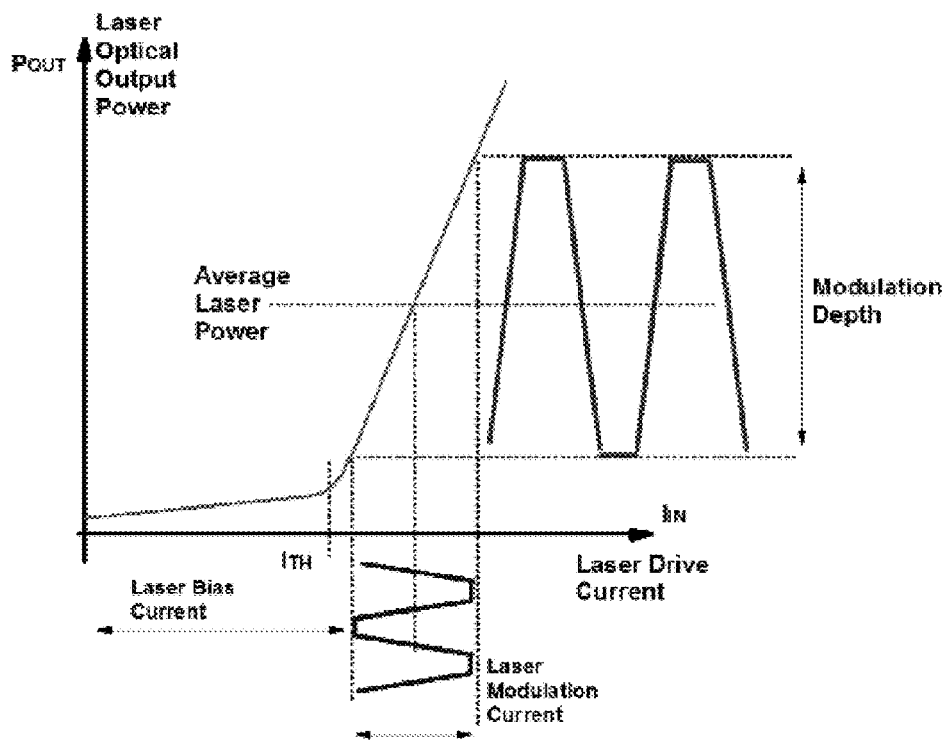
FIG. 1a shows a graph showing optical power against laser drive current for a laser, which shows modulation depth and modulation current.
Figure 1B:
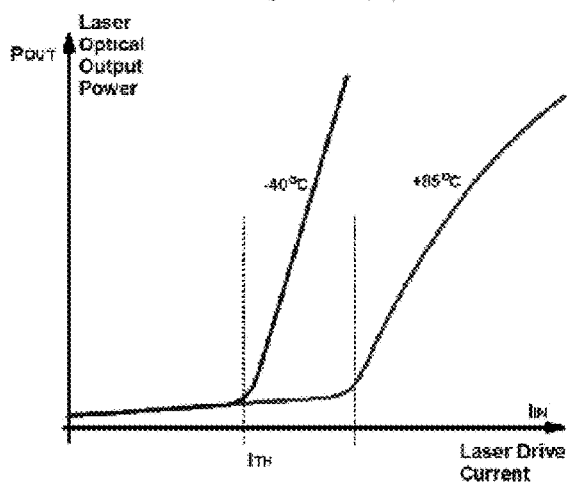
FIG. 1b shows a graph showing optical power against laser drive current for a laser operating at two different temperatures.

FIGS. 1a and 1b shows a representation of the characteristics of a typical laser in terms of the optical output power versus the supplied current. When the current is below a certain threshold there is no output, and above this the output is approximately linear with current. The value of the threshold current varies from device to device and also varies with junction temperature, particularly as the device heats up when in use. The characteristic can also show some non-linearity as temperature increases.

For fast switching and for a low noise in the optical signal, the modulation of the optical output is between a relatively high and a relatively low level, rather than switching on and off. The average power output of the laser is controlled in order not to exceed maximum ratings of the laser and to respect system level power specifications.

The laser characteristic (laser optical power outputs versus laser drive current) is often represented as a substantially straight line above the threshold current, and this is not unreasonable at moderate currents and lower operating temperatures. As the laser is driven harder with larger currents and heats up, the characteristic becomes less linear and flattens at higher current. FIG. 1b shows the characteristics for a laser at −40° C. and at 85° C. respectively. As can be seen threshold current increases with temperature and the characteristics of the laser diode are less linear at higher temperatures as compared with at lower temperatures.

Due to this departure from an ideal linear characteristic, if accurate control of the laser is needed over a wide range of power and temperature levels, it may be desirable to provide a control loop that does not rely on the assumption of a linear characteristic. However, in some embodiments, this may not be a concern. In some embodiments, the bias and modulation currents may be set at the start of a burst of operation. As a consequence, the laser can be assumed to be at or close to ambient temperature, where the characteristic is substantially linear. As the laser heats up, during the course of a data burst, then the values of the bias and modulation currents may be controlled by a more precise feedback system.

The modulation of the light output between relatively high and relatively low levels may be described in terms of modulation depth with the average laser power being between these two levels. The modulation of the light output between relatively high and relatively low levels may be described alternatively as the extinction ratio (ER), the latter being the ratio between the relatively high level and the relatively low level. The modulation depth is shown in FIG. 1a. FIG. 1a also shows the laser modulation current. The laser bias current is the laser drive current associated with the relatively low level. The bias current may be slightly larger than the threshold current. The laser modulation current is the associated current which provides the modulation depth. The ER may also conventionally be given in dB. This parameter determines the receiving function's ability to discriminate between the '1' and '0' symbol levels. Hence in order to ensure that in use the average laser output is well defined and that the ER is also within defined limits it is desirable to be able to determine and control the currents required for the optical high and optical low.

Figure 2:
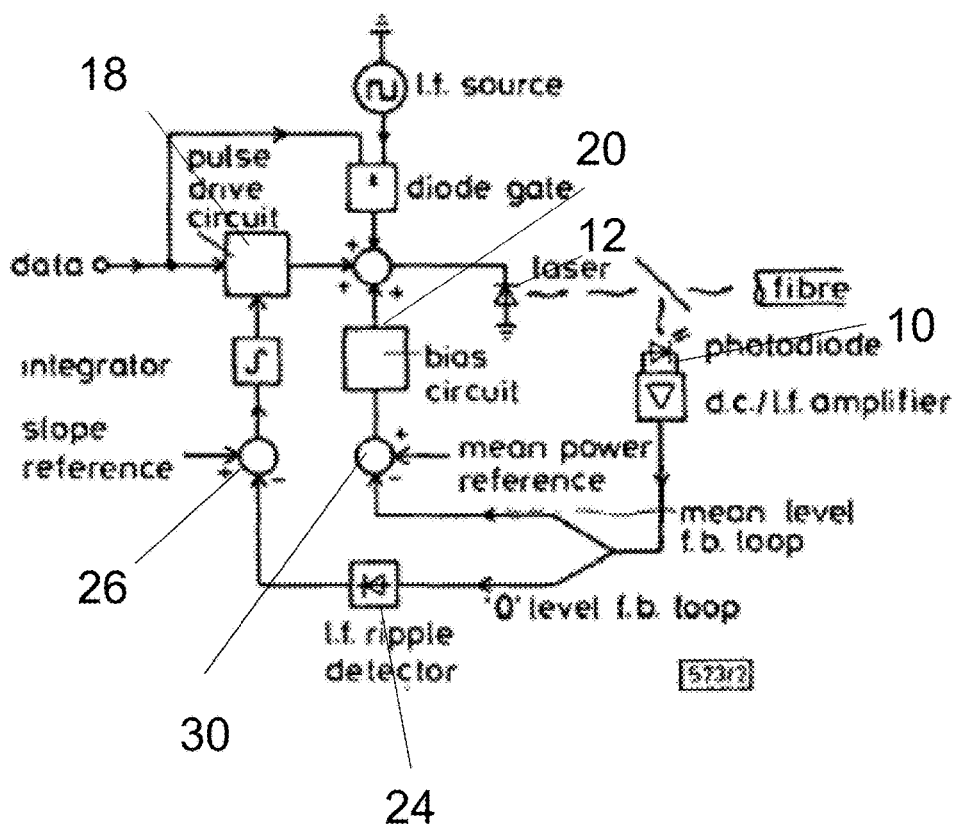
FIG. 2 shows a feedback arrangement for controlling laser modulation and bias according to a prior art arrangement.

Techniques for controlling the average output and modulation of the laser are known in continuous mode fibre optic communications systems. FIG. 2 shows an example of such system (due to Smith, Electronics Letters, October 1978 pp 775-776). The objectives of this system are to compare the optical levels with defined reference values and hence maintain the average and the ER despite tolerances, ageing and temperature fluctuations. Typically, a monitor photodiode 10 is fixed close to a transmitting laser diode 12 in order to receive a small fraction of the outgoing light signal. In the example system shown in FIG. 2, a low frequency (LF) modulation is added to the laser drive current. The signal from the monitor photodiode 10 representing the average is compared with a reference 30 so that the bias circuit 20 can maintain the average current in the laser. A detector 24 extracts the signal component containing the LF modulation from the monitor diode and this is used to estimate the slope of the laser characteristic. Comparing this with a reference for the slope 26 permits the modulation level to be set 18 and maintained.

A feature of control systems such as shown in FIG. 2 is that a feedback loop is used, and within this feedback loop there are typically filtering and averaging functions that of necessity have long time constants. Clearly, for an optical link operating in a continuous steady state, longer averaging times generally mean more accurate estimates of the desired power and modulation levels, and so there is a conflict between the requirements of fast settling and accurate control of power and ER.

An additional concern is that the combination of several time constants in such systems may lead to a second or higher order response such that it is possible to observe an overshoot in the settling behaviour.

In the case of a burst mode communications link, such time is unlikely to be available. It is also possible that a feedback loop constructed to settle quickly may exhibit overshoot, leading to possibly damaging current being supplied to the laser diode. On the other hand if a longer run-in is required for each data payload, the overall capacity of the communication system may be restricted.

It is an aim of some embodiments to eliminate the requirement for a long settling time in the control of the modulation depth (ER) in a burst mode system. This may be achieved by using quantitative information derived from a small number of run-in bursts and using this information to set the initial conditions in the control loop. For example, the small number of run in bursts may be two or one or more than two.

Figure 3:
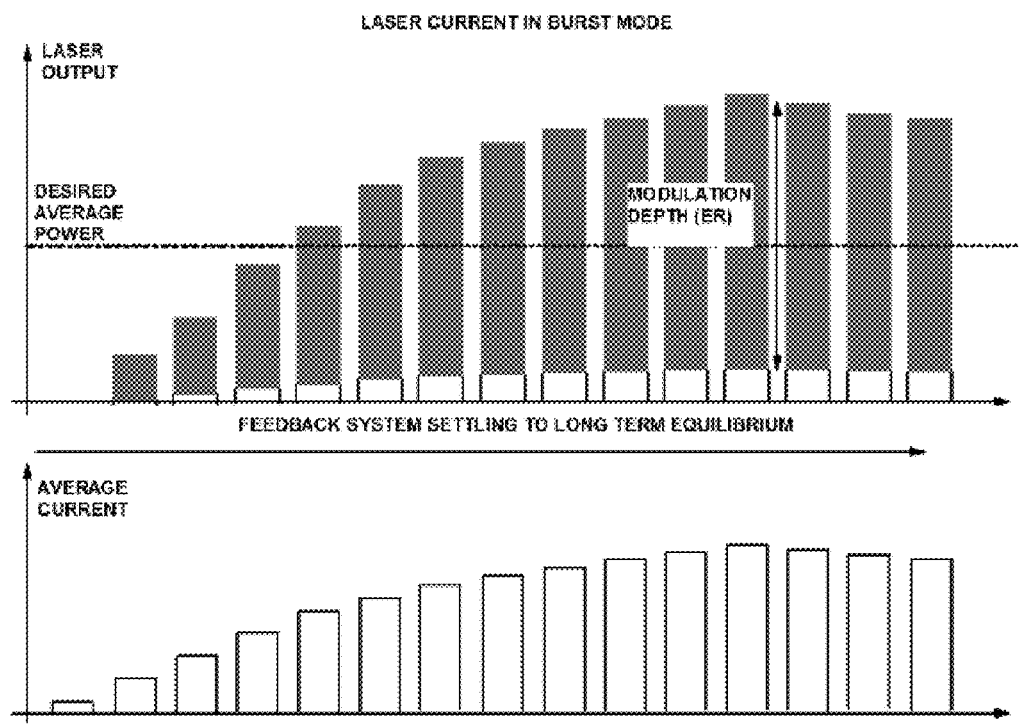
FIG. 3 shows a burst mode communications link at the start of a burst of data and the typical response of the bias and modulation current with a conventional feedback loop controlling the laser.

FIG. 3 shows a representation of the optical levels in a burst mode optical communications system where a control system of the abovementioned type shown in FIG. 2 is used to maintain the ER and average power. FIG. 3 shows in the first graph laser power output against time and in the second graph average current against time. The slow settling behaviour of the control loop leads to a long start-up phase, with the likelihood that the average power and ER are not correctly defined within the run-in period. This run-in typically requires that full performance is established within of the order of 5 data bursts, each of the order of only 200 ns or less. From the user's perspective, settling to full performance in the least number of bursts is advantageous. Further, if there is a second or higher order response in the control loop, there may be overshoot in the settling with a risk of exceeding the laser's maximum ratings.

It is an aim of some embodiments to provide a means of establishing correct and stable operating conditions for the transmitting laser diode within a relatively short time period, requiring only a minimum number of bursts in a run-in period, in such a way that it is also possible to use long time constants in the control system once started and hence maintain smooth control of power and ER when the link is active.

Figure 4:
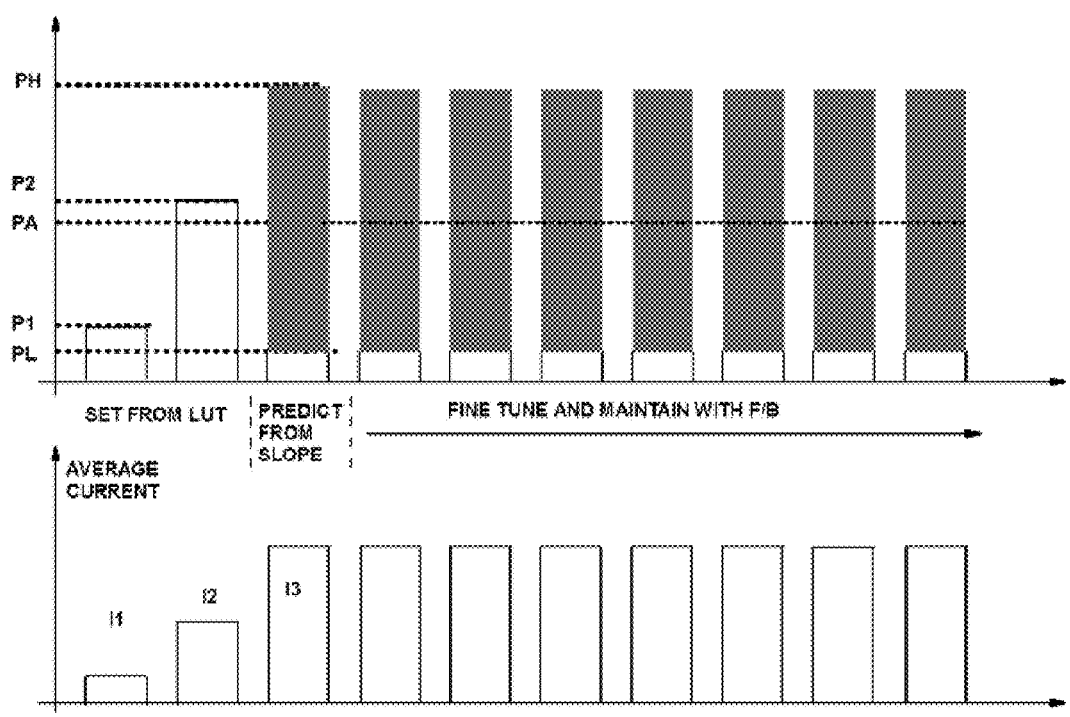
FIG. 4 illustrates the use of two bursts during a data run-in to provide information regarding the laser characteristic.

FIG. 4 shows a representation of bursts generated as part of the run-in of a system of an embodiment. In this embodiment, the output levels of the first two bursts are deliberately set at different values below the expected operating level. These levels are based on stored values derived either from factory calibration or from automatic calibration updates derived in normal operation. This method is described in more detail later.

In the first burst, a defined fixed current without data modulation is supplied to the laser at a level expected to result in a moderate output, for example at less than 50% of the expected operating output. The average level is determined from the monitor diode signal and this value is stored. For the second burst, the current supplied to the laser is increased to give a higher output to deliver, for example, 75% of the normal operating output. Again, the level observed from the monitor is measured and stored. A simple calculation can then be performed to determine good estimates of the slope and threshold values for the laser characteristics, and hence the initial current settings for the bias current and the modulation current needed for the correct average power and ER.

It will be obvious to one skilled in the art that the precise duration and timing intervals of the first two calibration bursts is not constrained by the specification of the particular communications system in use for the application. It may be convenient to respect the burst timing input from the system in the form of a "burst enable" signal. However, in some embodiments, the only restriction may be that the bursts are long enough for the monitor diode signal to be measured at the optical level corresponding to the current supplied in that burst. One convenient method is to apply two different laser drive currents during a single defined burst duration. In this way, it may be possible to have the system calibrated before the second burst interval.

Figure 5:
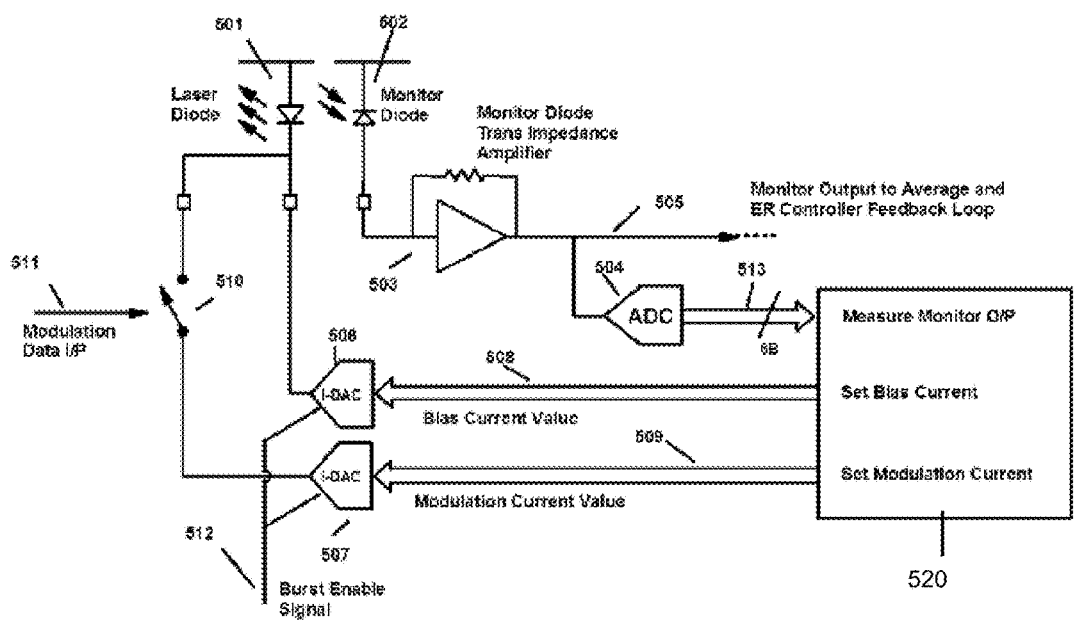
FIG. 5 schematically shows an arrangement according to an embodiment.

FIG. 5 shows an example of a system that can perform the desired functions according to one embodiment. One skilled in the art will immediately recognise that many other arrangements of circuitry and components can be employed to achieve substantially the same or similar result.

A transmitter laser diode 501 is supplied with bias current from a current mode digital to analogue converter (DAC) 506 and a modulation current from another current mode DAC 507. The modulation current is supplied by the modulation current DAC 507 which is switched on and off by a modulator 510 under the control of a data input 511. The modulator 510 is provided in the path between the modulation current DAC 507 and the laser diode 501. Both currents may be switched off together by the action of a burst enable control signal 512 input to each of the current DACs 506 and 507.

The optical output of the laser 501 is monitored by a monitor photodiode 502 provided adjacent to the laser diode. The monitor diode creates current that is converted to a voltage by a transimpedance amplifier (TIA) 503 arranged in series with the photodiode 502. The output 505 of the monitor TIA is fed to an average and ER control feedback loop (not shown in the figure) and to controller 520 via an ADC (analog to digital converter) 504. The digital output 513 of the ADC 504 is provided as an input to the controller 520.

In some embodiments, the monitor diode and associated TIA may have a bandwidth lower than the signal bandwidth, and the control systems may be configured to take this into account.

When running in a continuous mode, or with a long sequence of data bursts, digital values 508 controlling the bias current and digital values 509 controlling the modulation current are determined by the feedback loop control, and remain relatively stable, changing slowly with temperature. However, at the initiation of a data burst the control of the values 508 and 509 may be defined by the fast start algorithm which may be run by the controller 520.

Figure 7:
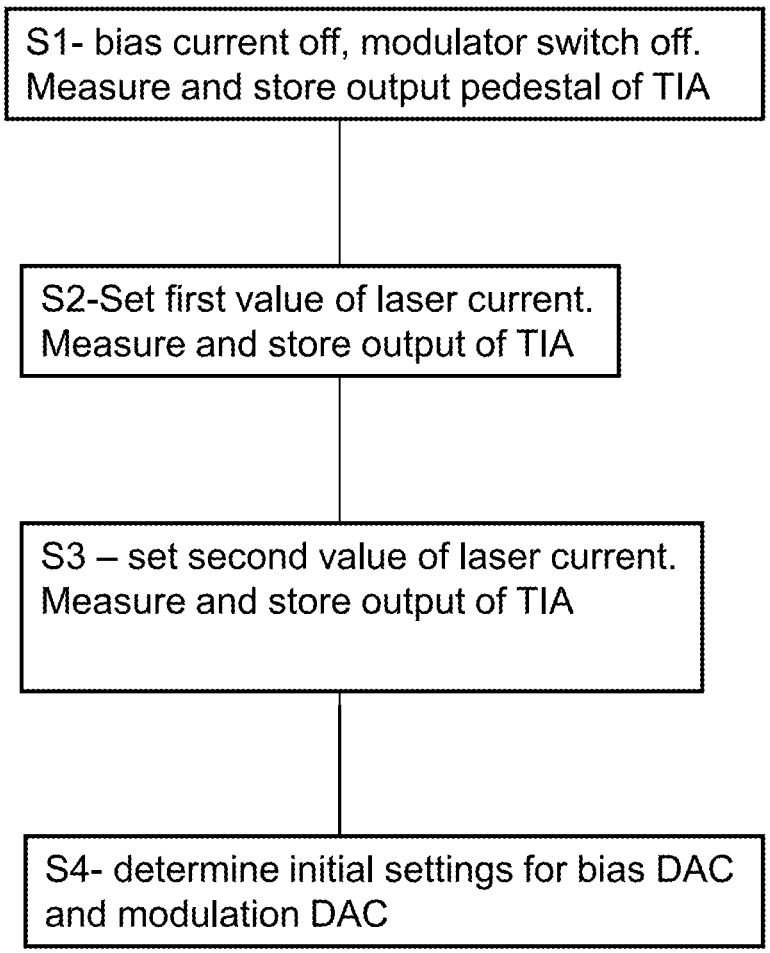
FIG. 7 shows a method of an embodiment.

An example of a suitable algorithm will now be described with reference to FIG. 7, but one skilled in the art will immediately recognise that many other algorithms will achieve an equivalent or similar function.

For the first step S1, the bias current is switched off and the modulator switch 510 is turned off. The output 505 of the monitor TIA is digitised by the analogue to digital converter (ADC) 504 and its value 513 is stored in memory in the controller. This step is used to establish the DC pedestal of the TIA 503 output 505 when there is no optical output, and the signal 505 at this point is due to the monitor diode's 502 leakage and amplifier offsets.

In step S2, a pre-defined value 509 for controlling the laser current is then set by the start-up algorithm such that the laser diode output is at some value for example less than 50% of its nominal maximum. This may be done using the bias current DAC 506 or the modulation DAC 507 with the switch 510 enabled or using a combination of the two respective control values 508 and 509. When the burst enable signal 512 is activated for the first burst of the run-in, the output 505 of the monitor TIA is digitised by the ADC 504 and its value 513 is stored. It should be appreciated that in some embodiments, the ADC 504 does not need to be of particularly high resolution or accuracy, and experience has shown that a 6 bit design may be sufficient for many applications.

In step S3, the laser current is then changed to a different, higher value for the second burst or using a combination of the two respective control values 508 and 509 for the bias and/or modulation DACs. When the burst enable signal 512 is activated, a new output value from the TIA 504 is digitised by the ADC to provide a value 513 which is stored.

In step S4, using these stored monitor TIA output values and the values set for the laser current for these two bursts, it is now possible to determine the initial setting 508 for the bias DAC 506 and the initial setting 509 for the modulation current DAC 507.

Figure 6:
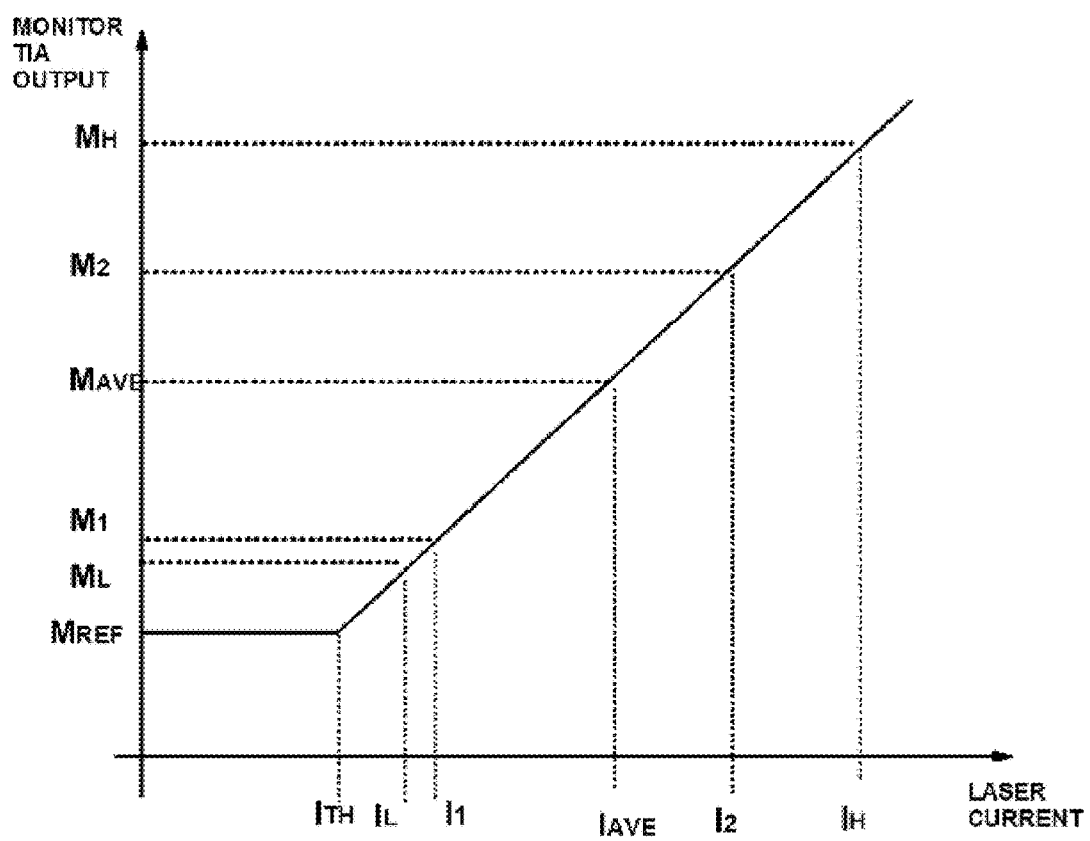
FIG. 6 shows a graph illustrating the use of information relating to the laser characteristics according to an embodiment.

FIG. 6 shows diagrammatically how the use of at least two defined laser values during the run-in to a data burst can provide the information to the algorithm which performs the calculation. MREF is the level observed at the output of the monitor TIA when there is no current in the laser, and represents the effects of leakage currents and amplifier offsets. I1 is the calibration current applied to the laser in a first calibration pulse, and M1 is the corresponding monitor TIA output observed. I2 is the calibration current applied to the laser in a second calibration pulse, and M2 is the corresponding monitor TIA output observed. IAVE is the desired average laser current to be used for the subsequent data transmission, and MAVE is the corresponding level observed at the monitor TIA output. IH and IL are the laser currents required for signalling a "1" level and for signalling a "0" level respectively at the desired ER. MH and ML are the corresponding "1" and "0" levels that would be observed in a steady state at the output of the monitor TIA.

The required values of IAVE and the ER value, as desired for the subsequent normal operation of the laser may be conveniently stored in advance in a local memory. The calibration current values I1 and I2 are also needed to perform the calculation, but these do not have to be any specific values, but rather fulfil the conditions that they are both within the normal operating range of the laser. The values may be conveniently stored in a local memory or look up table taking account of the specific laser used and optionally other factors such as ambient temperature. The values of I1 and I2 should preferably differ sufficiently such that the required computations can be made simply without significant rounding errors, for example if the calculation is to be made using limited range integer representations of the values.

An example of one method of performing the calculation is as follows:

$$S = \frac{M_2 - M_1}{I_2 - I_1} = \frac{M_1 - M_L}{I_1 - I_L} = \frac{M_H - M_2}{I_H - I_2}$$

and $$ER = \frac{M_H - M_{REF}}{M_L - M_{REF}}$$

$$I_{AVE} = \frac{I_H - I_L}{2}$$

$$M_{AVE} = \frac{M_H - M_L}{2}$$

So that $$M_{AVE} = S(I_{AVE} - I_1) + M_1$$

Hence $$M_L = \frac{2M_{AVE} + M_{REF}(ER - 1)}{(ER + 1)}$$

Resulting in $$I_L = \frac{(M_L - M_2)}{S} + I_2$$

Similarly we can derive $$I_H = \frac{(M_H - M_1)}{S} + I_1$$

In this example, the laser operating current has been defined in terms of the minimum and maximum currents representing the "1" and "0" levels. The bias and modulation currents can be derived from these values in a manner suitable for the particular implementation of the laser modulator. In the case of a DC modulator as depicted in FIG. 5, the bias current is equivalent to IL, and the modulation current is equivalent to (IH–IL). These current values are then used as the initial operating values, and are then adjusted by any feedback system, for example as shown in FIG. 2, to take account of heating of the laser, or of possible deviations of the laser's current vs optical power characteristic from a simple linear model.

It will be obvious to one skilled in the art that there are many ways in which to make the required calculations or determinations and define the operating currents, for example when the modulation is applied as an alternating current that is added and subtracted from an average bias current value.

An appropriately adapted computer program code product or products may be used for implementing the embodiments, when loaded on an appropriate data processing apparatus. The program code product for providing the operation may be stored on, provided and embodied by means of an appropriate carrier medium. An appropriate computer program can be embodied on a computer readable record medium. A possibility is to download the program code product via a data network. In general, the various embodiments may be implemented in hardware or special purpose circuits, software, logic or any combination thereof.

Various embodiments with different variations have been described here above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

The invention claimed is:

1. A system arranged to be used in a communication system wherein information is transmitted in a sequence of short bursts each of defined transmission period wherein the duration of each said burst is substantially longer than the duration of a single bit period and wherein those bursts containing a payload of data bits are preceded by a start-up phase comprising a number of run-in bursts each of a defined run-in transmission period, each of said run-in bursts having a minimum duration sufficient to allow measurement of the optical output power during each of said run-in bursts, said system comprising:

drive circuitry configured to apply to a laser diode in a first defined run-in transmission period of the start-up phase, said first defined run-in transmission period having a minimum duration sufficient to allow measurement of the optical output power during said first transmission period, a first data independent drive current independent of data signaling levels and then, in a second defined run-in transmission period of the start-up phase, said second defined run-in transmission period having a minimum duration sufficient to allow measurement of the optical output power during said second transmission period, a second different data independent drive current independent of data signaling levels, said first data independent drive current and second data independent drive current being such that said laser diode is configured to provide a first optical output and a second optical output respectively;

an optical sensor configured to provide a first sensor measurement output corresponding to said first optical output power of said laser diode and a second sensor measurement output corresponding to said second optical output power; and a controller configured to use a value of said first data independent drive current, a value of said second data independent drive current, said first sensor measurement output, said second sensor measurement output and at least one supplied input value to provide control values for said drive circuitry to control an operating current of said laser diode for a sequence of subsequent short bursts each of said defined transmission period carrying information.

2. A system as claimed in claim 1, wherein said operating current comprises an average current and a modulation current, and said controller is configured to use said value of said first data independent drive current, said value of said second data independent drive current, said first sensor measurement output and said second sensor measurement output and said at least one supplied input to determine an average current value and a modulation control value and provide control values in dependence on said average current and modulation control values.

3. A system as claimed in claim 2, wherein said drive circuitry is configured to provide said average current applied to said laser diode and said modulation current applied to said laser diode based on said control values for the sequence of subsequent short bursts each of defined period carrying information.

4. A system as claimed in claim 1, wherein said operating current comprises a greater operational current not greater than a maximum non-damaging operational current of the laser and a lesser operational current not less than the threshold current of the laser to be applied by said drive circuitry to said laser diode and said controller is configured to use said value of said first data independent drive current, said value of said second data independent drive current, said first sensor measurement output, said second sensor measurement output and said at least one supplied input to determine said lesser operational current value to be applied by said drive circuitry to said laser diode and said greater operational current value to be applied by said drive circuitry to said laser diode and provide control values in dependence on said greater operational current value and said lesser operational current value.

5. A system as claimed in claim 4, wherein said drive circuitry is configured to provide said greater operational current value and said lesser operational current value applied to said laser diode for the sequence of subsequent short bursts each of defined period carrying information based on said control values.

6. A system as claimed in claim 4, wherein said lesser operational current value is used for data '0' and said greater operational current is used for data '1'.

7. A system as claimed in claim 1, wherein said operating current comprises a bias current and a modulation current to be applied by said drive circuitry to said laser diode and said controller is configured to use said value of said first data independent drive current, said value of said data independent second drive current, said first sensor measurement output, said second sensor measurement output and at least one supplied input to determine a bias current value and a modulation control value and apply control values in dependence on said bias current value and said modulation control value.

8. A system as claimed in claim 7, wherein said drive circuitry is configured to provide a bias current applied to said laser diode and a modulation current applied to said laser diode for the sequence of subsequent short bursts each of defined period carrying information based on said control values.

9. A system as claimed in claim 1, wherein the controller configured to use a value of said first data independent drive current, a value of said second data independent drive current, said first sensor measurement output, said second sensor measurement output and at least one supplied input value to provide control values for said drive circuitry to control an operating current of said laser diode for a sequence of subsequent short bursts each of defined period carrying information.

10. A system as claimed in claim 1, wherein said first defined run-in transmission period of the start-up phase and second defined run-in transmission period of the start-up phase are successive transmission periods of the start-up phase.

11. A system as claimed in claim 1, wherein said optical sensor comprises a photodiode.

12. A system as claimed in claim 11, wherein said optical sensor comprises an analogue to digital convertor configured to convert said measurement output of said photodiode to a digital value to provide said first and second sensor measurement outputs.

13. A system as claimed in claim 1, wherein said drive circuitry is configured such that there is a further defined run-in transmission period of the start-up phase when no current is applied to said laser diode, the optical sensor is configured to provide a sensor measurement output corresponding to said defined run-in transmission period of the start-up phase when no current is applied to said laser diode, the controller configured to receive the output of said optical sensor when no current is applied to said laser diode and said output is used to adjust said first and second sensor measurement output values.

14. A system as claimed in claim 1, wherein said first and second data independent drive current values are configured to cause said laser diode to be operated within a substantially linear region of operation.

15. A method for communications wherein information is transmitted in a sequence of short bursts each of defined transmission period wherein the duration of each said burst is substantially longer than the duration of a single bit period and wherein those bursts containing a payload of data bits are preceded by a start-up phase comprising a number of run-in bursts, each of said run-in bursts having a minimum duration sufficient to allow measurement of the optical output power during each of said run-in bursts, said method comprising:

applying to a laser diode, in a first defined run-in transmission period of the start-up phase, said first defined run-in transmission period having a minimum duration sufficient to allow measurement of the optical output power during said first transmission period, a first data independent drive current independent of data signaling levels and then, in a second defined run-in transmission period of the start-up phase, said second transmission period having a minimum duration sufficient to allow measurement of the optical output power during said second transmission period, a second different data independent drive current independent of data signaling levels, said first data independent drive current and second data independent drive current being such that said laser diode is configured to provide a first optical output and a second optical output respectively;

providing a first sensor measurement output corresponding to said first optical output of said laser diode and a second sensor measurement output corresponding to said second optical output; and using a value of said first data independent drive current, a value of said second data independent drive current, said first sensor output, said second sensor output and said at least one supplied input to provide control values to control an operating current of said laser diode for the sequence of subsequent short bursts each of said defined transmission period carrying information.

16. A method as claimed in claim 15, wherein providing control values to control said operating current of said laser diode comprises:

determining an average current value and a modulation control value; and providing said control values in dependence on said average current value and said modulation control value.

17. A method as claimed in claim 15, wherein providing control values to control said operating current of said laser diode comprises:

determining a lesser operational current value not less than the threshold current of the laser to be applied to said laser diode, and a greater operational current value not greater than a maximum non-damaging operational current of the laser to be applied to said laser diode; and providing said control values in dependence on said greater operational current value and said lesser operational current value.

18. A method as claimed in claim 15, wherein providing control values to control said operating current of said laser diode comprises:

determining a bias current value and a modulation control value to be applied to said laser diode; and providing control values in dependence on said bias current value and said modulation control value.

19. A method of determining control values for determining an operating current of a laser diode used in a communication system wherein information is transmitted in a sequence of short bursts each of defined transmission period wherein the duration of each said burst is substantially longer than the duration of a single bit period and wherein those bursts containing a payload of data bits are preceded by a start-up phase comprising a number of run-in bursts, each of said run-in bursts having a minimum duration sufficient to allow measurement of the optical output power during each of said run-in bursts, said method comprising:

using a value of a first data independent drive current independent of data signaling levels, a value of a second data independent drive current independent of data signaling levels, a first sensor measurement output, a second sensor measurement output and at least one supplied input to provide control values for controlling said operating current of said laser diode, wherein said first data independent drive current value is applied to said laser diode in a first defined run-in transmission period of the start-up phase said first defined run-in transmission period having a minimum duration sufficient to allow measurement of the optical output power during said first transmission period, said first data independent drive current value causing said laser diode to provide a first optical output, said first sensor measurement output being dependent on said first optical output and said second data independent drive current is subsequently applied in a second defined run-in transmission period of the start-up phase, said second defined run-in transmission period having a minimum duration sufficient to allow measurement of the optical output power during said second transmission period, said second data independent drive current value causing said laser diode to provide a second optical output, said second sensor measurement output being dependent on said second optical output.

* * * * *